(12) United States Patent
Konishi

(10) Patent No.: US 7,473,111 B2
(45) Date of Patent: Jan. 6, 2009

(54) CONNECTING TERMINAL FOR RECEIVING LEAD TERMINAL IN PRINTED WIRING BOARD

(75) Inventor: Ikuo Konishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/867,280

(22) Filed: Oct. 4, 2007

(65) Prior Publication Data

US 2008/0144301 A1 Jun. 19, 2008

(30) Foreign Application Priority Data

Dec. 19, 2006 (JP) ............................. 2006-341979

(51) Int. Cl.
*H01R 12/00* (2006.01)
(52) U.S. Cl. .......................................... 439/82; 439/83
(58) Field of Classification Search ................... 439/82, 439/83, 81
See application file for complete search history.

(56) References Cited

U.S. PATENT DOCUMENTS

| | | | | |
|---|---|---|---|---|
| 2,871,551 | A | * | 2/1959 | Harris .......................... 428/571 |
| 3,190,953 | A | * | 6/1965 | Keller .......................... 174/262 |
| 3,327,284 | A | * | 6/1967 | Crimmins .................... 439/389 |
| 3,412,149 | A | * | 11/1968 | Grewe et al. .................... 564/85 |
| 3,528,173 | A | * | 9/1970 | Gall .............................. 29/839 |
| 3,654,583 | A | * | 4/1972 | Mancini ........................ 439/82 |
| 3,784,955 | A | * | 1/1974 | Reynolds et al. ............... 439/79 |
| 4,570,338 | A | * | 2/1986 | Ignatowicz .................... 29/845 |
| 5,131,853 | A | * | 7/1992 | Meyer .......................... 439/82 |
| 5,295,862 | A | * | 3/1994 | Mosquera .................... 439/567 |
| 5,911,606 | A | | 6/1999 | Matsumura |
| RE37,961 | E | | 1/2003 | Matsumura |
| 2002/0094708 | A1 | * | 7/2002 | Budman et al. ............... 439/82 |

FOREIGN PATENT DOCUMENTS

| JP | 9246800 A | 9/1997 |
|---|---|---|
| JP | 2001250608 A | 9/2001 |
| JP | 3104494 U | 9/2004 |

* cited by examiner

*Primary Examiner*—Gary F. Paumen
(74) *Attorney, Agent, or Firm*—Westerman, Hattori, Daniels & Adrian, LLP.

(57) ABSTRACT

A connecting terminal has an electrically-conductive ring surrounding a columnar space. Electrically-conductive elastic pieces extend from the electrically-conductive ring in the direction of the central axis of the columnar space. Electrically-conductive blades stand from the outer surfaces of the electrically-conductive elastic pieces. A lead terminal is received in the columnar space. The tip ends of the electrically-conductive elastic pieces are urged against the lead terminal. The lead terminal is prevented from withdrawing out of the through hole. Electric connection is established between the lead terminal and the elastic pieces. The blade or blades of the connecting terminal or terminals stick into the wall surface of the through hole. The connecting terminal is thus firmly held in the through hole. Electric connection is established between the blade or blades and the through hole. Electric connection is thus established between the lead terminal and the through hole.

8 Claims, 10 Drawing Sheets

CONNECTING TERMINAL FOR RECEIVING LEAD TERMINAL IN PRINTED WIRING BOARD

BACKGROUND OF THE INVENTION

1. Field of the Invention

The present invention relates to a printed circuit board unit including a printed wiring board defining a through hole, and a connecting terminal received in the through hole.

2. Description of the Prior Art

Sockets are conventionally utilized for a printed wiring board as disclosed in Japanese Utility Model Registration Publication No. 3104494. The sockets are received in through holes defined in a printed wiring board, respectively. The sockets receive lead terminals of an electronic component, respectively. Electric connection is in this manner established between the lead terminals and the corresponding through holes.

The sockets are soldered to the through holes one by one. Manual operation is required to solder the sockets. A worker must handle the soldering iron, for example. The worker needs skills in soldering. It takes a considerably long time to set the sockets.

SUMMARY OF THE INVENTION

It is accordingly an object of the present invention to provide a connecting terminal for receiving a lead terminal in a printed wiring board, capable of avoiding soldering. It is an object of the present invention to provide a printed circuit board unit utilizing the connecting terminal.

According to a first aspect of the present invention, there is provided a printed circuit board unit comprising: a printed wiring board; a through hole penetrating through the printed wiring board from a front surface to a back surface of the printed wiring board; a connecting terminal received in the through hole, the connecting terminal defining an columnar space inside; and an electronic component including a lead terminal received in the columnar space of the connecting terminal, wherein the connecting terminal includes: an electrically-conductive ring surrounding the columnar space; electrically-conductive elastic pieces extending from the electrically-conductive ring in the direction of the central axis of the columnar space so as to get into the columnar space, the electrically-conductive elastic pieces contacting with the lead terminal; and an electrically-conductive blade or blades standing from the outer surface or surfaces of one or more of the electrically-conductive elastic pieces, the electrically-conductive blade or blades sticking into the inside surface of the through hole.

The printed circuit board unit allows a lead terminal to be received in the columnar space of the connecting terminal. Elastic force is generated in the electrically-conductive elastic pieces to urge the tip ends of the electrically-conductive elastic pieces toward the central axis of the columnar space. The elastic pieces strongly contact with the lead terminal. The lead terminal is thus prevented from withdrawing out of the through hole. Electric connection is established between the lead terminal and the elastic pieces. On the other hand, the blade or blades of the connecting terminal or terminals stick into the wall surface of the through hole. The connecting terminal is thus firmly held in the through hole. Electric connection is established between the blade or blades and the through hole. Electric connection is thus established between the lead terminal and the through hole.

The connecting terminal allows the electronic component to get mounted on the printed wiring board solely in response to insertion of the lead terminals into the through holes. All the lead terminals can be fixed to the printed wiring board on a single application of urging force. This results in omission of soldering. In particular, if so-called surface mount devices (SMDs) are mounted on the front and back surfaces of the printed wiring board, for example, the front and back surfaces of the printed wiring board are subjected to reflow process. IMDs must be mounted on the printed wiring board after the completion of the reflow process. The IMDs are thus soldered to the printed wiring board in a conventional technique. A worker is required to have skills for soldering. Moreover, the lead terminals are soldered one by one. It takes a longer time to complete soldering all the lead terminals. The connector and other electronic components in the vicinity of the connector are inevitably subjected to the heat of the soldering iron. The printed circuit board unit can be incorporated in an electronic apparatus, for example.

A specific connecting terminal may be provide to realize the printed circuit board unit. The specific connecting terminal may comprise: an electrically-conductive ring surrounding a columnar space; electrically-conductive elastic pieces extending from the electrically-conductive ring in the direction of the central axis of the columnar space, the electrically-conductive elastic pieces extending into the columnar space; and an electrically-conductive blade or blades standing from the outer surface or surfaces of one or more of the electrically-conductive elastic pieces. The connecting terminal significantly contributes to establishment of the printed circuit board unit. A sliding surface may be defined on the inner surface of the elastic piece to allow the sliding movement of the lead terminal. The outer edges of the blade or blades may protrude outward from the columnar space.

According to a second embodiment of the present invention, there is provided a printed circuit board unit comprising: a printed wiring board; a through hole penetrating through the printed wiring board from a front surface to a back surface of the printed wiring board; and a connecting terminal received in the through hole, the connecting terminal defining a columnar space inside, wherein the connecting terminal includes: an electrically-conductive ring surrounding the columnar space; electrically-conductive elastic pieces extending from the electrically-conductive ring in the direction of the central axis of the columnar space so as to get into the columnar space, the electrically-conductive elastic pieces contacting with the lead terminal; and an electrically-conductive blade or blades standing from the outer surface or surfaces of one or more of the electrically-conductive elastic pieces, the electrically-conductive blade or blades sticking into the inside surface of the through hole. The printed circuit board unit significantly contributes to establishment of the aforementioned printed circuit board unit.

According to a third aspect of the present invention, there is provided a printed circuit board unit comprising: a printed wiring board; a through hole penetrating through the printed wiring board from a front surface to a back surface of the printed wiring board; a connecting terminal received in the through hole, the connecting terminal defining a columnar space inside; and an electronic component including a lead terminal received in the columnar space of the connecting terminal, wherein the connecting terminal includes: a surrounding member surrounding a columnar space, the surrounding member defining a gap along a generatrix of the columnar space; first electrically-conductive elastic pieces formed on the inner surface of the surrounding member, the first electrically-conductive elastic pieces extending into the columnar space; and second electrically-conductive elastic pieces formed on the outer surface of the surrounding member, the second electrically-conductive elastic pieces protruding outward to stick into the inside surface of the through hole.

The printed circuit board unit allows a lead terminal to be received in the columnar space of the connecting terminal. Elastic force is applied to the first elastic pieces toward the central axis of the columnar space. The first elastic pieces strongly contact with the lead terminal. The lead terminal is thus prevented from withdrawing out of the through hole. Electric connection is established between the lead terminal and the first elastic pieces. Elastic force is applied to the second elastic pieces to urge the second elastic pieces outward from the columnar space. The second elastic pieces correspondingly stick into the inside surface of the through hole. The connecting terminal firmly engages the inside surface of the through hole. Electric connection is established between the second elastic pieces and the through hole. Electric connection is thus established between the lead terminal and the through hole.

The connecting terminal allows the electronic component to get mounted on the printed wiring board solely in response to insertion of the lead terminals into the through holes. All the lead terminals can be fixed to the printed wiring board on a single application of urging force. This results in omission of soldering. The printed circuit board unit of this type can be incorporated in an electronic apparatus, for example.

A specific connecting terminal may be provided to realize the printed circuit board unit. The specific connecting terminal may comprise: a surrounding member surrounding a columnar space, the surrounding member defining a gap along a generatrix of the columnar space; first electrically-conductive elastic pieces formed on the inner surface of the surrounding member, the first electrically-conductive elastic pieces extending into the columnar space; and second electrically-conductive elastic pieces formed on the outer surface of the surrounding member, the second electrically-conductive elastic pieces protruding outward. The connecting terminal significantly contributes to establishment of the printed circuit board unit.

According to a fourth aspect of the present invention, there is provided a printed circuit board unit comprising: a printed wiring board; a through hole penetrating through the printed wiring board from a front surface to a back surface of the printed wiring board; and a connecting terminal received in the through hole, the connecting terminal defining a columnar space inside, wherein the connecting terminal includes: a surrounding member surrounding a columnar space, the surrounding member defining a gap along a generatrix of the columnar space; first electrically-conductive elastic pieces formed on the inner surface of the surrounding member, the first electrically-conductive elastic pieces extending into the columnar space; and second electrically-conductive elastic pieces formed on the outer surface of the surrounding member, the second electrically-conductive elastic pieces protruding outward to contact with the inside surface of the through hole. The printed circuit board unit significantly contributes to establishment of the aforementioned printed circuit board units.

According to a fifth aspect of the present invention, there is provided a printed circuit board unit comprising: a printed wiring board defining a through hole; an electronic component including a lead terminal inserted into the through hole; and a connecting terminal received in the through hole to receive the lead terminal, the connecting terminal establishing electric connection between the through hole and the lead terminal, wherein the connecting terminal includes: a ring receiving the lead terminal; electrically-conductive elastic pieces extending from the ring in the direction of the lead terminal; and an electrically-conductive protrusion or protrusions formed on the outer surface or surfaces of one or more of the electrically-conductive elastic pieces.

The printed circuit board unit allows a lead terminal to be received in a space defined in the connecting terminal. Elastic force is generate in the electrically-conductive elastic pieces to urge the tip ends of the electrically-conductive pieces toward the central axis of the space. The elastic pieces strongly contact with the lead terminal. The lead terminal is thus prevented from withdrawing out of the through hole. Electric connection is established between the lead terminal and the elastic pieces. On the other hand, the protrusions stick into the inside wall of the through hole. The connecting terminal firmly engages with the inside surface of the through hole. Electric connection is established between the protrusions and the through hole. Electric connection is thus established between the lead terminal and the through hole.

A specific connecting terminal may be provided to realize the printed circuit board unit. The specific connecting terminal may be received in a through hole formed in a printed wiring board, the connecting terminal comprising: a ring receiving a lead terminal of an electronic component; electrically-conductive elastic pieces extending from the ring in the direction of the lead terminal; and an electrically-conductive protrusion or protrusions formed on the outer surface or surfaces of one or more of the electrically-conductive elastic pieces.

According to a sixth aspect of the present invention, there is provided a printed circuit board unit comprising: a printed wiring board defining a through hole; an electronic component including a lead terminal inserted into the through hole; and a connecting terminal received in the through hole to receive the lead terminal, the connecting terminal establishing electrical connection between the lead terminal and the through hole, wherein the connecting terminal comprises: a surrounding member having a diameter smaller than the diameter of the through hole and larger than the diameter of a lead terminal of an electronic component, the surrounding member receiving the lead terminal; first elastic protrusions formed on the surrounding member, the first elastic protrusions extending inward from the surrounding member for urging the lead terminal; and second elastic protrusions formed on the surrounding member, the second elastic protrusions extending outward from the surrounding member for contacting the inside surface of the through hole.

The printed circuit board unit allows a lead terminal to be received in the surrounding member. The first elastic protrusions are urged against the lead terminal. The lead terminals are thus prevented from withdrawing out of the through hole. Electric connection is established between the lead terminal and the first elastic protrusions. The second elastic protrusions are urged against the inside surface of the through hole. The second elastic protrusions thus stick into the inside surface of the through hole. The connecting terminal in this manner firmly engages with the inside surface of the through hole. Electric connection is established between the second elastic protrusions and the through hole. Electric connection is thus established between the lead terminal and the through hole.

The connecting terminal allows the electronic component to get mounted on the printed wiring board solely in response to insertion of the lead terminals into the through holes. The lead terminals can be fixed to the printed wiring board on a single application of urging force. This results in omission of soldering. The printed circuit board unit can be incorporated in an electronic apparatus, for example.

A specific connecting terminal may be provided to realize the printed circuit board unit. The specific connecting terminal may received in a through hole formed in a printed wiring board, the connecting terminal comprising: a surrounding member having a diameter smaller than the diameter of the through hole and larger than the diameter of a lead terminal of an electronic component, the surrounding member receiving the lead terminal; first elastic protrusions formed on the surrounding member, the first elastic protrusions extending inward from the surrounding member for contact with the lead terminal; and second elastic protrusions formed on the surrounding member, the second elastic protrusions extending outward from the surrounding member for contact with the inside surface of the through hole.

A gap may be formed in the surrounding member to extend in the direction along the central axis of the surrounding member. The gap may extend along the entire axial length of the surrounding member. The first and second elastic protrusions made of cut pieces continuous with the surrounding member, the cut pieces cut out of the surrounding member for bending inward and outward, respectively.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
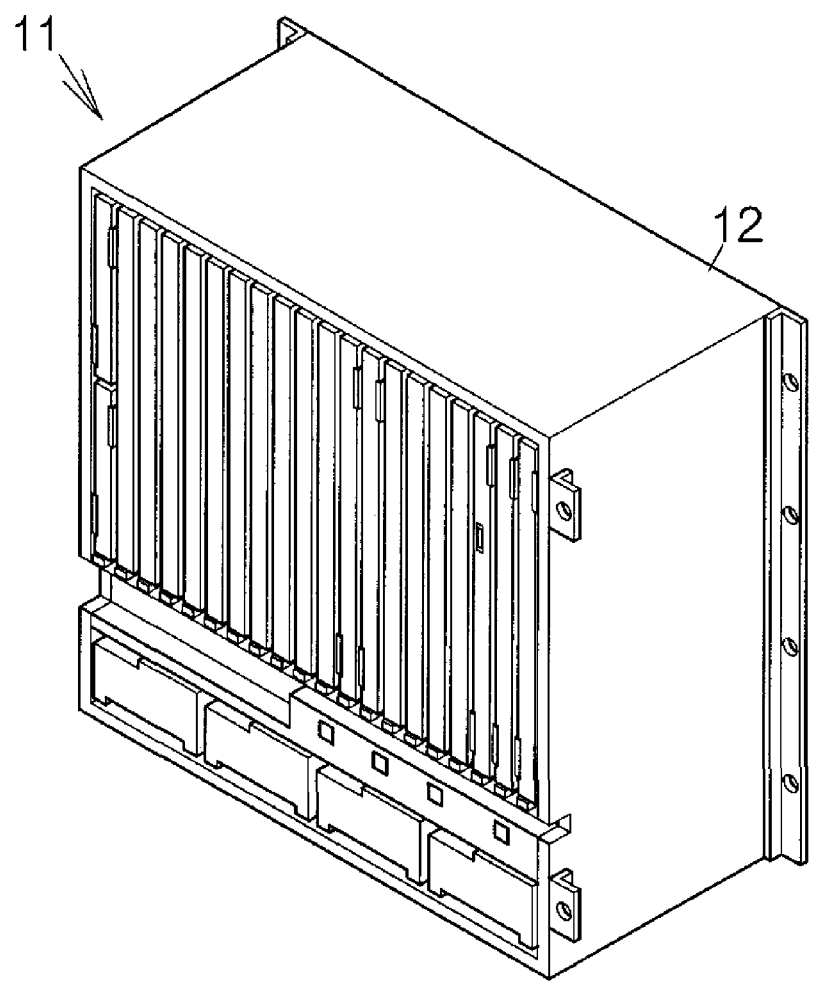
FIG. 1 is a perspective view schematically illustrating a transmission apparatus as an example of an electronic apparatus according to the present invention.

FIG. 1 schematically illustrates a transmission apparatus 11 as a specific example of an electronic apparatus according to the present invention. The transmission apparatus 11 is incorporated in a dense wavelength division multiplexing (DWDM) communication system, for example. The transmission apparatus 11 may be mounted on a rack, for example. The transmission apparatus 11 includes an enclosure 12. A printed circuit board unit is placed in the inner space defined in the enclosure 12.

Figure 2:
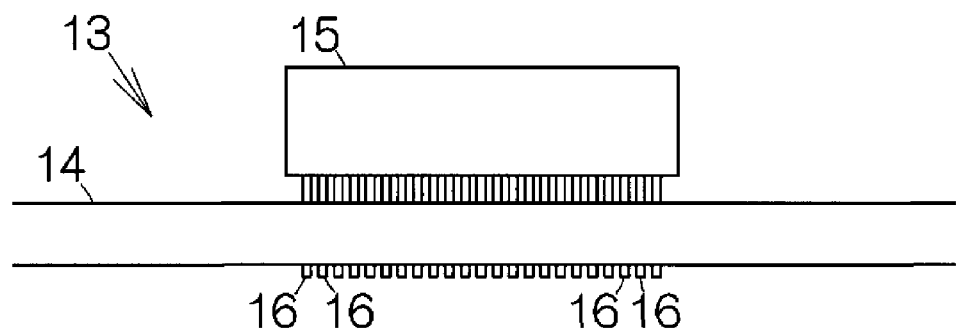
FIG. 2 is an enlarged partial side view schematically illustrating a printed circuit board unit according to the present invention.

As shown in FIG. 2, the printed circuit board unit 13 includes a printed wiring board 14 made of resin, for example. The printed wiring board 14 is made of an epoxy resin containing glass fiber cloth, for example. The printed wiring board 14 has the thickness of 1.6 mm approximately, for example. An electronic component such as a connector 15 is mounted on the front or/and back surface of the printed wiring board 14.

Each connector 15 includes lead terminals 16. Each lead terminal 16 takes the shape of an elongated column, for example. The lead terminal 16 has the outer diameter of 0.6 mm approximately, for example. The lead terminal 16 is made of an electrically-conductive material such as copper. The lead terminal 16 is received in a through hole formed in the printed wiring board 14 as described later in detail. The connector 15 forms a so-called insertion mount device (IMD).

Figure 3:
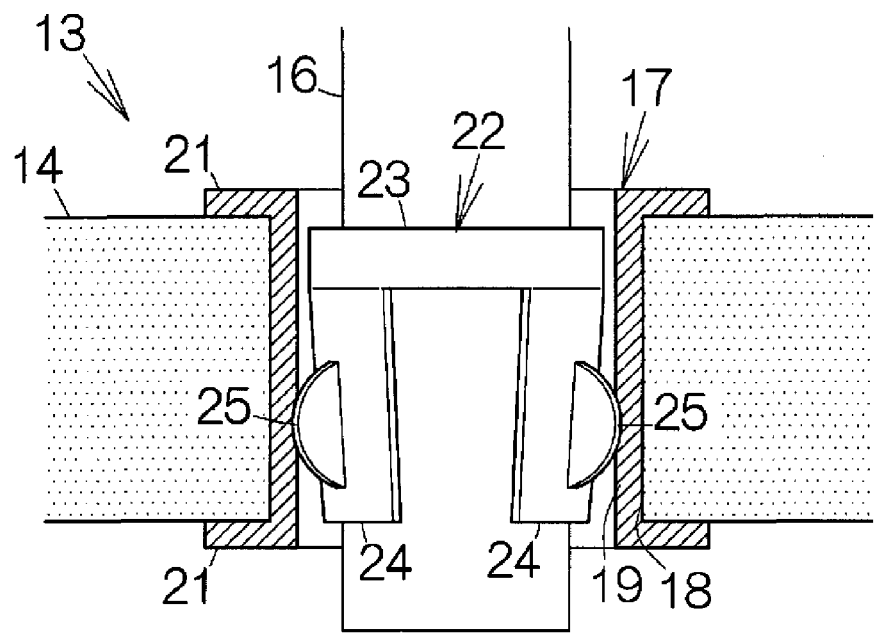
FIG. 3 is an enlarged partial sectional view schematically illustrating a lead terminal fixed in a printed wiring board.

As shown in FIG. 3, the individual lead terminal 16 is received in the through hole 17 in the printed wiring board 14. The through hole 17 includes a bare through hole 18 penetrating through the printed wiring board 14 from the front surface to the back surface of the printed wiring board 14. A cylindrical metal wall 19 is formed along the inside surface of the bare through hole 18. The metal wall 19 has the inner diameter of 0.9 mm approximately, for example. The metal wall 19 is connected to land patterns 21 on the front and back surfaces of the printed wiring board 14. The metal wall 19 and the land patterns 21 may be made of an electrically-conductive material such as copper.

A connecting terminal 22 is located in the individual through hole 17. The connecting terminal 22 includes a ring 23 surrounding a columnar space. The outer diameter of the ring 23 is set smaller than the inner diameter of the metal wall 19. The inner diameter of the ring 23 is set larger than the outer diameter of the lead terminal 16. Three elastic pieces 24 are formed integral with the ring 23, for example. The elastic pieces 24 extend downward from the ring 23 toward the back surface of the printed wiring board 14 in the direction of the central axis of the columnar space. The elastic pieces 24 are set nearly in parallel with the central axis. The elastic pieces 24 get closer to the central axis of the columnar space as the position gets remoter from the ring 23. The elastic pieces 24 are arranged at regular intervals in the circumferential direction of the ring 23.

The connecting terminal 22 includes protrusions or blades 25 standing from the outer surfaces of the elastic pieces 24, respectively. The outer edge of each of the blades 25 protrudes outward from the columnar space. The blade 25 is designed to extend along the centerline of symmetry of the elastic piece 24. The outer edge of the blade 25 may be defined as a curved surface, for example. The blade 25 sticks into the metal wall 19. Electric connection is thus established between the blade 25 and the metal wall 19. The connecting terminal 22 may be made of an electrically-conductive material such as phosphor bronze.

The lead terminal 16 is received in the columnar space of the connecting terminal 22. Elastic force is applied to the tip end of the individual elastic piece 24 toward the central axis of the columnar space. The tip ends of the elastic pieces 24 strongly contact with the outer periphery of the lead terminal 16. The tip ends of the elastic pieces 24 in combination firmly hold the lead terminal 16. Electric connection is established between the lead terminal 16 and the connecting terminal 22 in this manner.

The blades 25 serve to fix the connecting terminal 22 in the through hole 17 in the printed circuit board unit 13. The tip ends of the elastic pieces 24 strongly bite into the outer periphery of the lead terminal 16. The tip ends of the elastic pieces 24 serve to restrict the movement of the lead terminal 16 from the back surface toward the front surface of the printed wiring board 14. The lead terminal 16 is thus prevented from withdrawing from the through hole 17. The connecting terminal 22 allows omission of soldering for mounting the connector 15 onto the printed wiring board 14.

Figure 4:
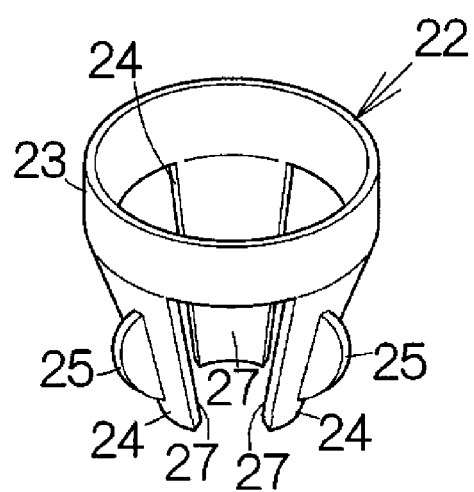
FIG. 4 is a perspective view schematically illustrating a connecting terminal according to a first embodiment of the present invention.
Figure 5:
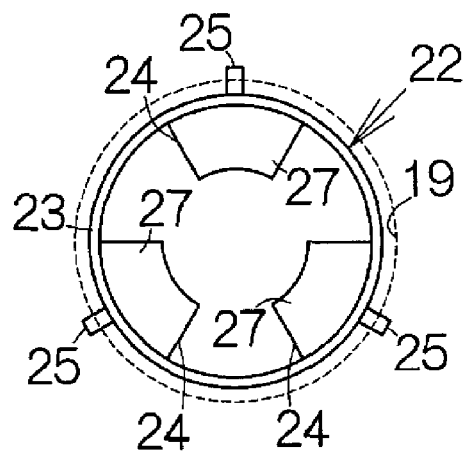
FIG. 5 is a plan view schematically illustrating the connecting terminal.

As shown in FIG. 4, when the connector 15 is to be mounted on the printed wiring board 14, the aforementioned connecting terminals 22 are prepared for the respective through holes 17. Molding process may be employed to form the connecting terminals 22, for example. The die may have a shape for defining a void corresponding to the form of the connecting terminals 22. The elastic pieces 24 of the connecting terminal 22 are designed to extend into the columnar space. The connecting terminal 22 defines a sliding surface 27 on the inner surface of each of the elastic piece 24. The sliding surface 27 is defined along a space in the form of a truncated cone. The sliding surface 27 allows the sliding movement of the lead terminal 16, as described later. As shown in FIG. 5, the outer edges of the blades 25 protrude outward from an imaginary columnar space fit inside the inside surface of the metal wall 19.

Figure 6:
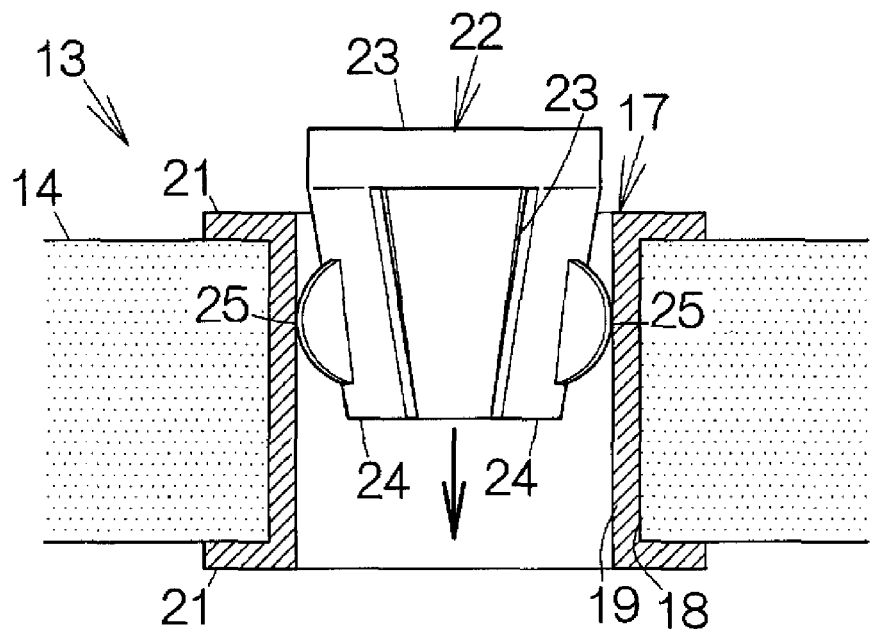
FIG. 6 is an enlarged partial sectional view schematically illustrating the connecting terminal inserted into a through hole.

As shown in FIG. 6, the connecting terminals 22 are respectively inserted into the through holes 17 from the front surface of the printed wiring board 14, for example. Since the outer edges of the blades 25 of the connecting terminal 22 protrude outward from the imaginary columnar space defined with the inside surface of the metal wall 19, the elastic pieces 24 are forced to bend inward in response to the contact between the elastic pieces 24 and the inside surface of the metal wall 19. Elastic force is thus stored in the elastic pieces 24 so as to urge the blades 25 against the inside surface of the metal wall 19. The connecting terminal 22 is thus kept within the through hole 22 at a predetermined position.

Figure 7:
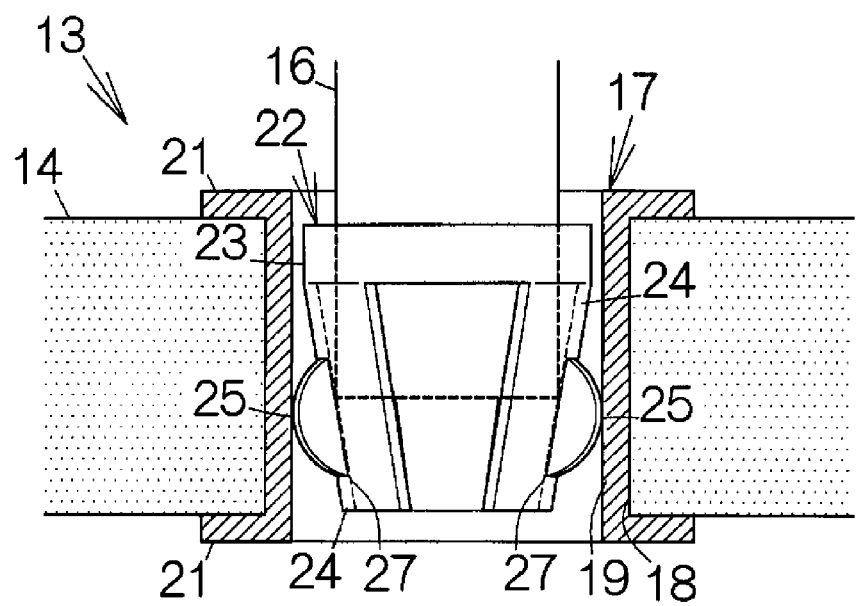
FIG. 7 is an enlarged partial sectional view schematically illustrating the lead terminal inserted into the connecting terminal.

As shown in FIG. 7, the lead terminals 16 are respectively inserted into the corresponding through holes 17 from the front surface of the printed wiring board 14, for example. All of the lead terminals 16 are simultaneously inserted into the corresponding through holes 17. Each of the lead terminals 16 is received into the columnar space of the connecting terminal 22. The tip end of the lead terminal 16 slides along the sliding surfaces 27 of the elastic pieces 24. As the lead terminal 16 advances deeper into the columnar space, the lead terminal 16 drives the elastic pieces 24 outward from the columnar space. The blades 25 thus correspondingly stick into the metal wall 19. Elastic force of the elastic pieces 24 serves to urge the tip ends of the elastic pieces 24 toward the central axis of the columnar space.

When the tip end of the lead terminal 16 penetrates through the columnar space of the connecting terminal 22, the tip end of the lead terminal 16 protrudes from the back surface of the printed wiring board 14 by a predetermined length. The blades 25 stick into the metal wall 16 by a sufficient depth. The tip ends of the elastic pieces 24 bite into the outer periphery of the lead terminal 16 while the connecting terminal 22 engages with the inside surface of the through hole 17. The lead terminal 16 is thus prevented from withdrawing out of the through hole 17. The connector 15 is in this manner mounted on the printed wiring board 14.

The connecting terminal 22 allows the connector 15 to get mounted on the printed wiring board 14 solely in response to insertion of the lead terminals 16 into the corresponding through holes 17. All of the lead terminals 16 can be fixed to the printed wiring board 14 upon a single application of urging force. This results in omission of soldering. In particular, if so-called surface mount devices (SMDs) are mounted on the front and back surfaces of the printed wiring board 14, for example, the front and back surfaces of the printed wiring board 14 are subjected to reflow process. IMDs must be mounted on the printed wiring board 14 after the completion of the reflow process. The IMDs are thus soldered to the printed wiring board 14 in a conventional technique. A worker is required to have skills for soldering. Moreover, the lead terminals 16 are soldered one by one. It takes a longer time to complete soldering all the lead terminals 16. The connector and other electronic components in the vicinity of the connector are inevitably subjected to the heat of the soldering iron.

Figure 8:
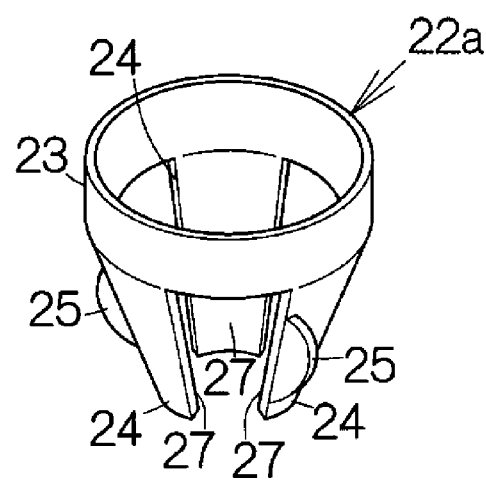
FIG. 8 is a perspective view schematically illustrating a connecting terminal according to a modification of the first embodiment.

As shown in FIG. 8, the blades 25 may extend along the side edges of the elastic pieces 24, respectively. The blades 25 may be aligned with a generatrix of the columnar space. During the molding process for making such a connecting terminal 22a, the blades 25 may extend on the outer surface of a space of a truncated cone defined along the inner surfaces of the elastic pieces 24. The blades 25 may be bent outward from the columnar space after the molding process. The connecting terminal 22a can be formed in a relatively facilitated manner.

Figure 9:
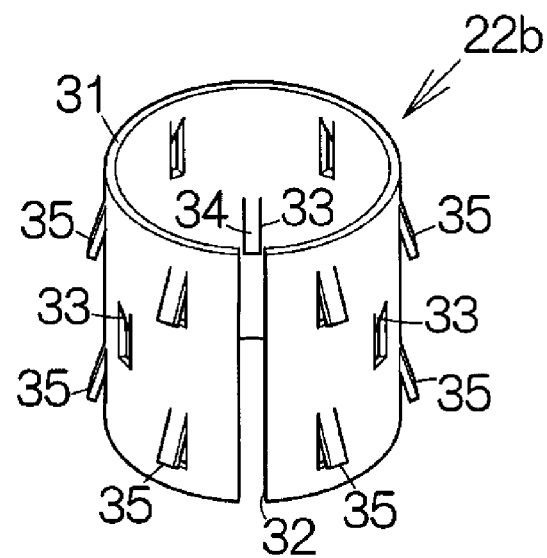
FIG. 9 is a perspective view schematically illustrating a connecting terminal according to a second embodiment of the present invention.

FIG. 9 schematically illustrates a connecting terminal 22b according to a second embodiment of the present invention. The connecting terminal 22b includes a cylindrical surrounding member 31 defining a columnar space. The outer diameter of the surrounding member 31 is set smaller than the inner diameter of the metal wall 19. The inner diameter of the surrounding member 31 is set larger than the outer diameter of the lead terminal 16. The surrounding member 31 is made of an electrically-conductive material such as phosphor bronze. A gap 32 is defined in the surrounding member 31 along a generatrix of the columnar space. The gap 32 extends from the upper end to the lower end of the surrounding member 31. The gap 32 allows variation in the circumferential length of the surrounding member 31 in a range of the width of the gap 32.

Three first elastic protrusions or first elastic pieces 33 are formed on the inner surface of the surrounding member 31, for example. The first elastic pieces 33 extend into the columnar space. The first elastic pieces 33 are arranged at regular intervals in the circumferential direction of the surrounding member 31. The first elastic pieces 33 are designed to extend downward from the surrounding member 31. The individual first elastic piece 33 gets remoter from the inside surface of the surrounding member 31 as the position gets closer to the lower end of the surrounding member 31. The first elastic pieces 33 are formed integral with the surrounding member 31. A sliding surface 34 is defined on the inward surface of each of the first elastic pieces 33. The sliding surface 34 allows the sliding movement of the lead terminal 16.

Second elastic protrusions or second elastic pieces 35 are formed on the outer surface of the surrounding member 31. The second elastic pieces 35 are arranged in upper and lower rows, for example. Each row includes six of the second elastic pieces 35, for example. The elastic pieces 35 in the row are arranged at regular intervals in the circumferential direction of the surrounding member 31, for example. The second elastic pieces 35 are designed to extend downward from the surrounding member 31. The individual second elastic piece 35 gets remoter from the outside surface of the surrounding member 31 as the position gets closer to the lower end of the surrounding member 31. The second elastic pieces 35 protrude outward from an imaginary columnar space fit inside the inside surface of the metal wall 19. The second elastic pieces 35 are formed integral with the surrounding member 31. The connecting terminal 22b may be made of an electrically-conductive material such as phosphor bronze.

The connecting terminal 22b may be made of a single plate material, for example. The single plate may be bent to provide the surrounding member 31. The first elastic pieces 33 may be bent inward from the plate material after the first elastic piece 33 are partly cut out of the plate material. Likewise, the second elastic pieces 35 may be bent outward from the plate material after the second elastic piece 35 are partly cut out of the plate material.

Figure 10:
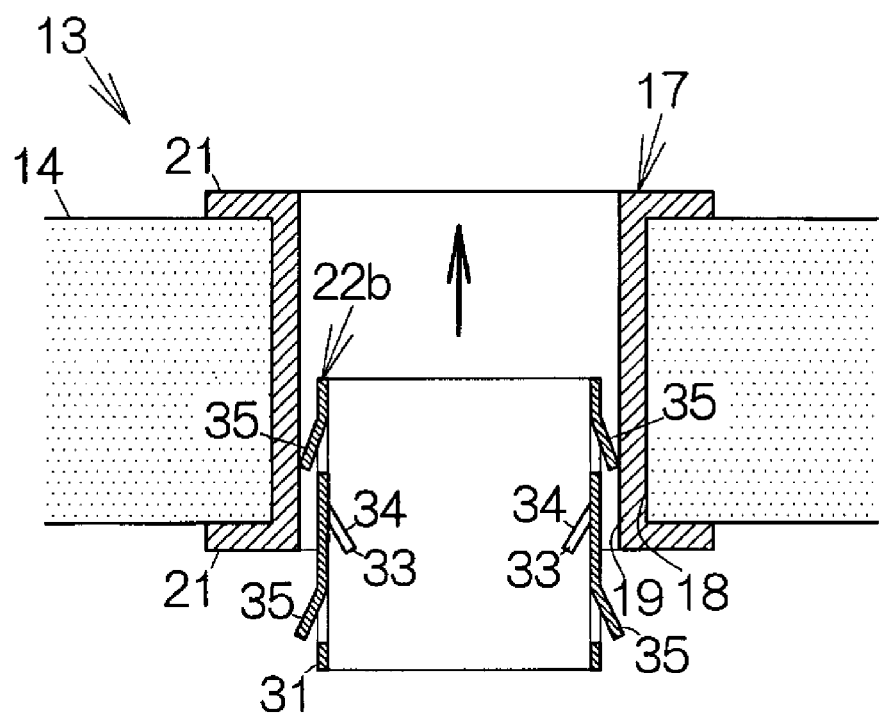
FIG. 10 is an enlarged partial sectional view schematically illustrating the connecting terminal inserted into the through hole.

As shown in FIG. 10, the connecting terminals 22b are respectively inserted into the through holes 17 from the back surface of the printed wiring board 14. Since the outer ends of the second elastic pieces 35 of the connecting terminal 22b protrude outward from the imaginary columnar space defined with the inside surface of the metal wall 19, the second elastic pieces 35 are forced to receive a reaction from the inside surface of the metal wall 19. Elastic force is thus stored in the surrounding member 31 so as to urge the tip ends of the second elastic pieces 35 against the inside surface of the metal wall 19. The surrounding member 31 gets smaller in the circumferential direction. The connecting terminal 22b is in this manner kept within the through hole 17 at a predetermined position.

Figure 11:
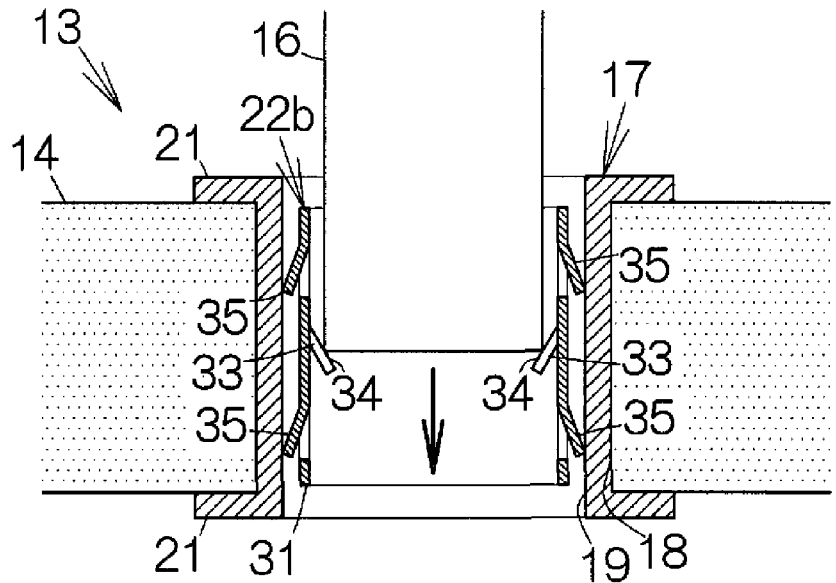
FIG. 11 is an enlarged partial sectional view schematically illustrating the lead terminal inserted into the connecting terminal.

As shown in FIG. 11, the lead terminals 16 are respectively inserted into the corresponding through holes 17 from the front surface of the printed wiring board 14. Each of the lead terminals 16 is received in the columnar space of the connecting terminal 22b. The tip end of the lead terminal 16 slides along the sliding surfaces 34 of the first elastic pieces 33. The first elastic pieces 33 generate elastic force to urge the tip ends of the first elastic pieces 33 against the outer periphery of the lead terminal 16. As the lead terminal 16 advances deeper into the columnar space, the lead terminal 16 serves to expand the surrounding member 31 outward from the columnar space.

The surrounding member 31 gets larger in the circumferential direction. The second elastic pieces 35 correspondingly stick into the metal wall 19.

Figure 12:
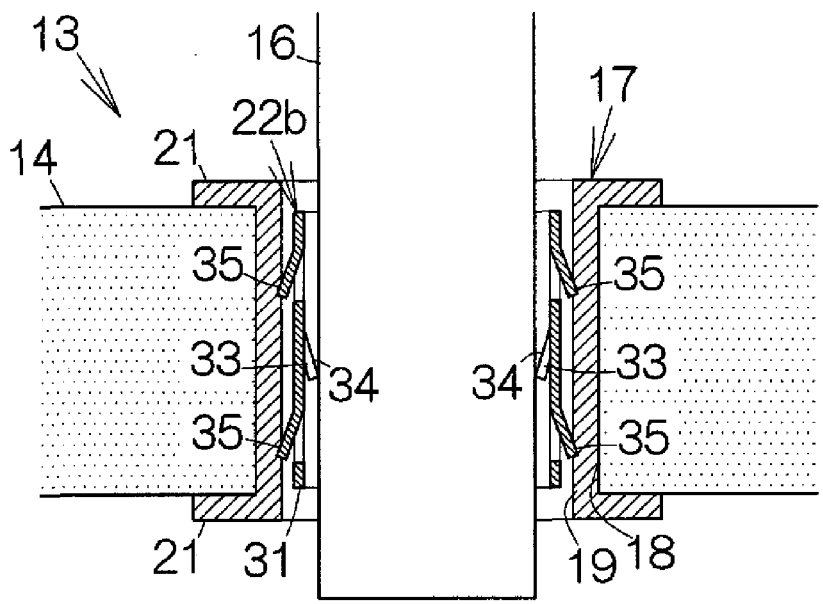
FIG. 12 is an enlarged partial sectional view schematically illustrating the lead terminal completely received in the printed wiring board.

When the tip end of the lead terminal 16 penetrates through the columnar space of the connecting terminal 22b, the tip end of the lead terminal 16 protrudes from the back surface of the printed wiring board 14 by a predetermined length. As shown in FIG. 12, the second elastic pieces 35 stick into the metal wall 19 by a sufficient depth. The connecting terminal 22b is engaged with the inside surface of the through hole 17 in this manner. The tip ends of the first elastic pieces 33 bite into the outer periphery of the lead terminal 16. The lead terminal 16 is thus prevented from withdrawing out of the through hole 17. The connector 15 is in this manner mounted on the printed wiring board 14. Electric connection is established between the lead terminal 16 and the through hole 17.

The second elastic pieces 35 of the connecting terminal 22b stick into the metal wall 19 in the printed circuit board unit 13. The connecting terminal 22b is held in the through hole 17. The tip ends of the first elastic pieces 33 bite into the lead terminal 16. The tip ends of the first elastic pieces 33 serve to restrict the movement of the lead terminal 16 from the back surface toward the front surface of the printed wiring board 14. The lead terminal 16 is thus prevented from withdrawing out of the through hole 17. The connecting terminals 22b allow the connector 15 to get mounted on the printed wiring board 14 solely in response to insertion of the lead terminals 16 into the corresponding through holes 17 in the same manner as described above. All of the lead terminals 16 can be fixed to the printed wiring board 14 upon a single application of urging force. This results in omission of soldering.

Figure 13:
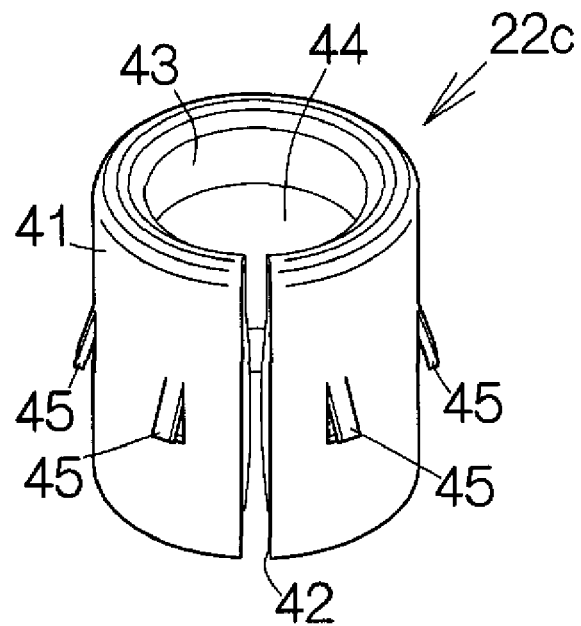
FIG. 13 is a perspective view schematically illustrating a connecting terminal according to a third embodiment of the present invention.

FIG. 13 schematically illustrates a connecting terminal 22c according to a third embodiment of the present invention. The connecting terminal 22c includes a cylindrical surrounding member 41 defining a columnar space. The outer diameter of the surrounding member 41 is set smaller than the inner diameter of the metal wall 19. The inner diameter of the surrounding member 41 is set larger than the outer diameter of the lead terminal 16. A gap 42 is defined in the surrounding member 41 along a generatrix of the columnar space. The gap 42 extends from the upper end to the lower end of the surrounding member 41. A first elastic piece 43 is formed integral with the inner surface of the surrounding member 41.

Figure 14:
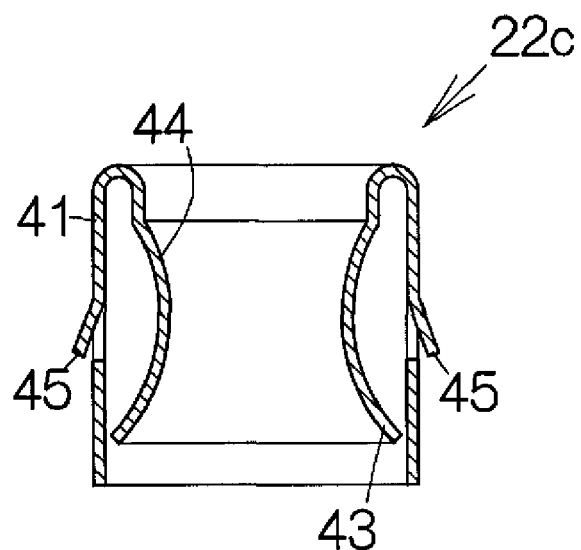
FIG. 14 is a vertical sectional view schematically illustrating the connecting terminal according to the third embodiment of the present invention.

Referring also to FIG. 14, the first elastic piece 43 is connected to the upper end of the surrounding member 41. The first elastic piece 43 is formed in a cylindrical shape, for example. The first elastic piece 43 extends into the columnar space. The aforementioned gap 42 is likewise formed in the first elastic piece 43. A sliding surface 44 is defined on the inward surface of the first elastic piece 43. The gap 42 allows variation in the circumferential length of the surrounding member 41 and the first elastic piece 43 in a range of the width of the gap 42.

Second elastic pieces 45 are formed on the outer surface of the surrounding member 41. The second elastic pieces 45 are designed to extend downward from the surrounding member 41. The individual second elastic piece 45 gets remoter from the outside surface of the surrounding member 41 as the position gets closer to the lower end of the surrounding member 41. The second elastic pieces 45 protrude outward from an imaginary columnar space fit inside the inside surface of the metal wall 19. The second elastic pieces 45 are formed integral with the surrounding member 41. The connecting terminal 22c may be made of an electrically-conductive material such as phosphor bronze. The connecting terminal 22b may be made of a plate material based on bending process, for example.

The connecting terminals 22c are respectively inserted into the through holes 17 from the back surface of the printed wiring board 14. Since the outer ends of the second elastic pieces 45 of the connecting terminal 22c protrude outward from the imaginary columnar space defined with the inside surface of the metal wall 19, the second elastic pieces 45 are forced to receive a reaction from the inside surface of the metal wall 19. Elastic force is thus stored in the surrounding member 41 so as to urge the tip ends of the second elastic pieces 45 against the inside surface of the metal wall 19. The surrounding member 41 gets smaller in the circumferential direction. The connecting terminal 22c is in this manner kept within the through hole 17 at a predetermined position.

The lead terminals 16 are respectively inserted into the corresponding through holes 17 from the front surface of the printed wiring board 14. Each of the lead terminals 16 is received in the columnar space of the connecting terminal 22b. The tip end of the lead terminal 16 slides along the sliding surface 44 of the first elastic piece 43. The first elastic piece 43 generates elastic force to urge the tip ends of the first elastic piece 33 against the outer periphery of the lead terminal 16. As the lead terminal 16 advances deeper into the columnar space, the lead terminal 16 serves to expand the surrounding member 41 outward from the columnar space. The surrounding member 41 gets larger in the circumferential direction. The second elastic pieces 45 correspondingly stick into the metal wall 19.

Figure 15:
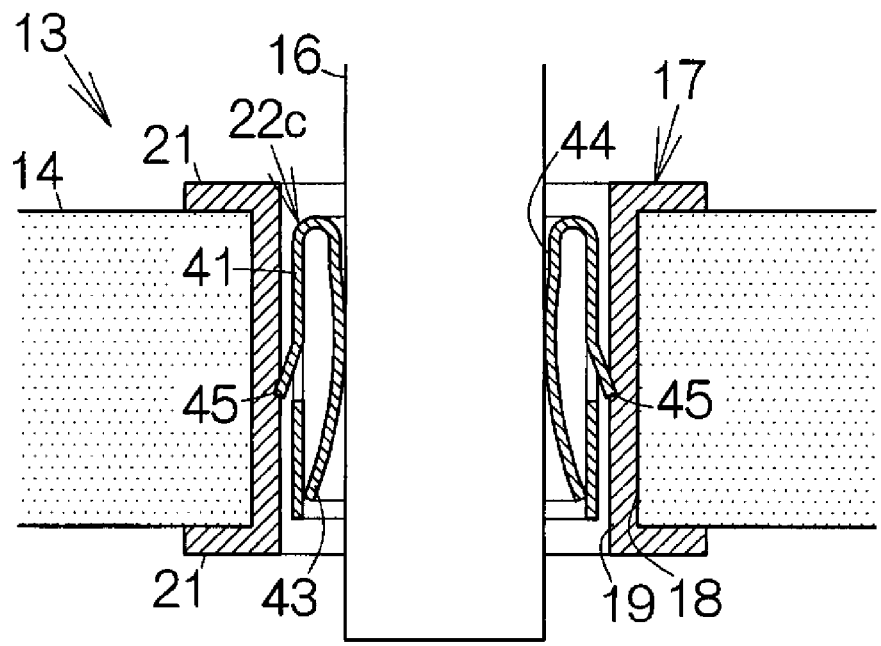
FIG. 15 is an enlarged partial sectional view schematically illustrating the connecting terminal completely received within the through hole.

When the tip end of the lead terminal 16 penetrates through the columnar space of the connecting terminal 22c, the tip end of the lead terminal 16 protrudes from the back surface of the printed wiring board 14 by a predetermined length. As shown in FIG. 15, the second elastic pieces 45 stick into the metal wall 19 by a sufficient depth. The connecting terminal 22c is engaged with the inside surface of the through hole 17 in this manner. The first elastic piece 43 is strongly urged against the outer periphery of the lead terminal 16. The lead terminal 16 is thus prevented from withdrawing from the through hole 17. The connector 15 is in this manner mounted on the printed wiring board 14 in this manner. Electric connection is established between the lead terminal 16 and the through hole 17.

The second elastic pieces 45 of the connecting terminal 22c stick into the metal wall 19 in the printed circuit board unit 13. The connecting terminal 22c is held in the through hole 17. The tip end of the first elastic piece 43 strongly contacts with the lead terminal 16. The lead terminal 16 is thus prevented from withdrawing out of the through hole 17. The connecting terminal 22c allows the connector 15 to get mounted on the printed wiring board 14 solely in response to insertion of the lead terminals 16 into the corresponding through holes 17 in the same manner as described above. All of the lead terminals 16 can be fixed to the printed wiring board 14 upon a single application of urging force. This results in omission of soldering.

Figure 16:
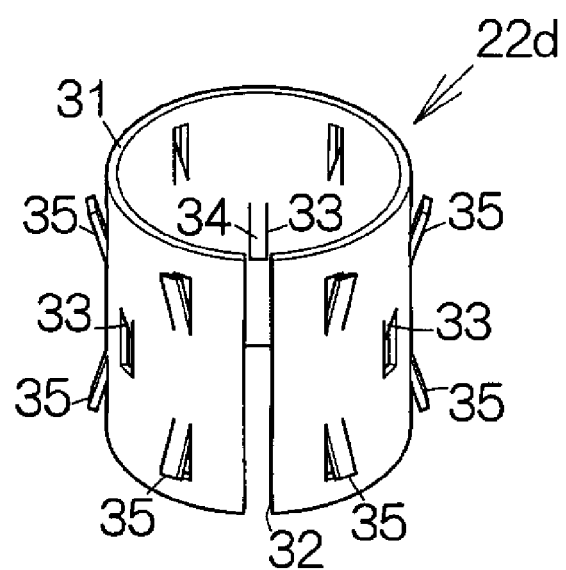
FIG. 16 is a perspective view schematically illustrating a connecting terminal according to a fourth embodiment of the present invention.

FIG. 16 schematically illustrates a connecting terminal 22d according to a fourth embodiment of the present invention. The second elastic pieces 35 in the uppermost row are designed to extend upward from the surrounding member 31 in the connecting terminal 22d. The second elastic pieces 35 in the lower row are designed to extend downward from the surrounding member 31. Like reference numerals are attached to the structure or components equivalent to those of the aforementioned connecting terminal 22b.

Figure 17:
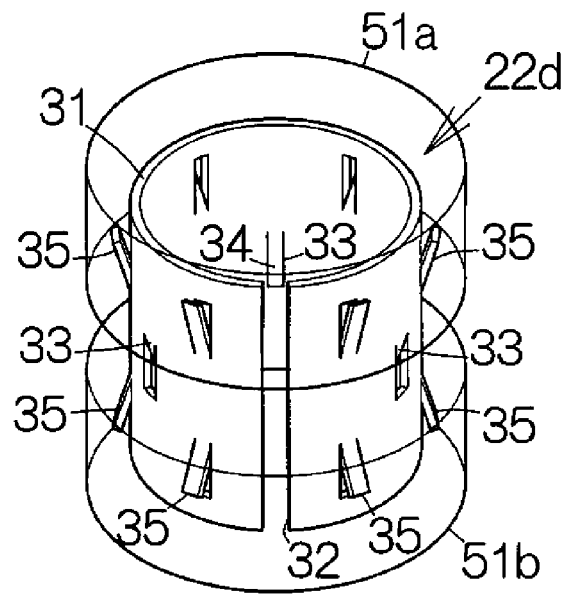
FIG. 17 is a perspective view schematically illustrating tubes attached to the connecting terminal.

As shown in FIG. 17, a tube 51a is put on the upper end of the surrounding member 31 of the connecting terminal 22d prior to insertion of the connecting terminal 22d into the through hole 17. A tube 51b is likewise put on the lower end of the surrounding member 31. The tubes 51a, 51b shrink in response to heat or ultraviolet rays, for example. The tubes 51a, 51b squeeze the surrounding member 31. The second elastic pieces 35 move toward the columnar space. The surrounding member 31 gets smaller in the circumferential direction based on the gap 32. The tube 51a on the upper end is then removed.

Figure 18:
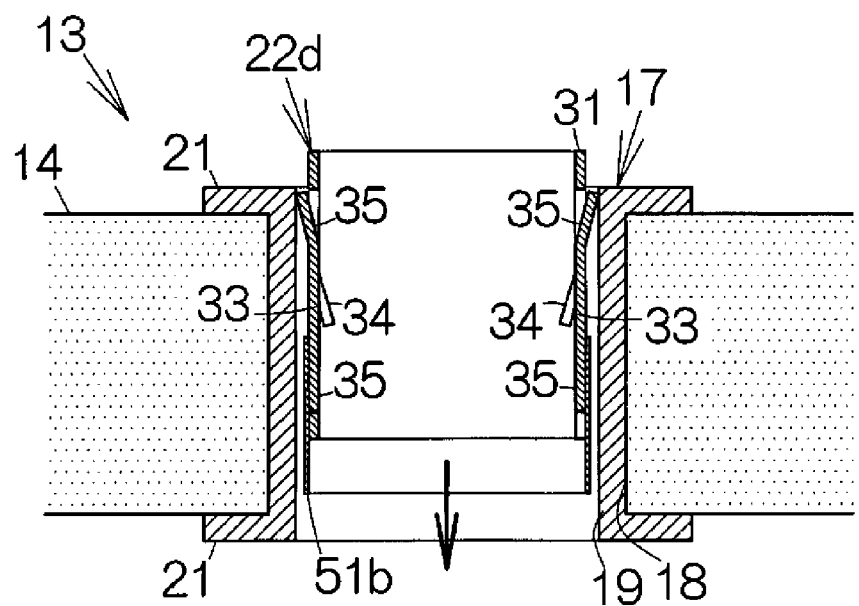
FIG. 18 is an enlarged partial sectional view schematically illustrating the connecting terminal inserted into the through hole.

As shown in FIG. 18, the connecting terminals 22d are respectively inserted into the corresponding through holes 17 from the front surface of the printed wiring board 14. The tube 51b serves to push the second elastic pieces 35 in the lower row into the surrounding member 31. The second elastic pieces 35 of the upper row slide along the inside surface of the metal wall 19. The second elastic pieces 35 of the upper row are urged against the inside surface of the metal wall 19. The connecting terminal 22d is in this manner held in the through hole 17 at a predetermined position. The tube 51b is then removed from the connecting terminal 22d. The second elastic pieces 35 of the lower row are urged against the inside surface of the metal wall 19.

Figure 19:
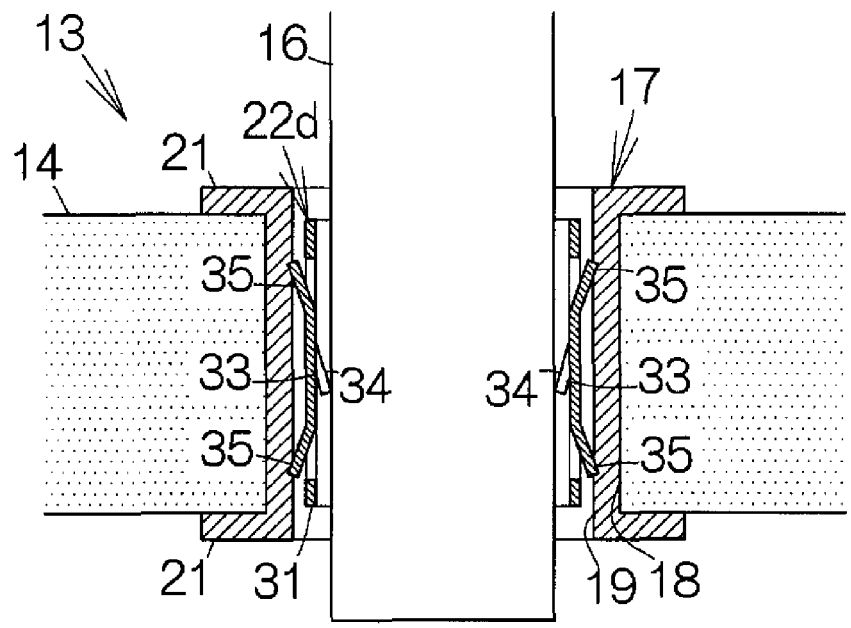
FIG. 19 is an enlarged partial sectional view schematically illustrating the lead terminal completely received in the printed wiring board.

The lead terminal 16 is then inserted into the columnar space of the connecting terminal 22d. As shown in FIG. 19, the surrounding member 31 is forced to expand outward. The surrounding member 31 gets larger in the circumferential direction. The second elastic pieces 35 bite into the metal wall 19. The first elastic pieces 33 strongly contact with the outer periphery of the lead terminal 16. The connector 15 is in this manner mounted on the printed wiring board 14. Electronic connection is established between the lead terminal 16 and the through hole 17.

The second elastic pieces 35 serve to hold the connecting terminal 22d within the through hole 17 in the printed circuit board unit 13 in the same manner as described above. The first elastic pieces 33 serve to prevent the lead terminal 16 from withdrawing out of the through hole 17. The connecting terminals 22d allow the connector 15 to get mounted on the printed wiring board 14 solely in response to insertion of the lead terminals 16 into the corresponding through holes 17 in the same manner as described above. All of the lead terminals 16 can be fixed to the printed wiring board 14 upon a single application of urging force. This results in omission of soldering.

Moreover, the second elastic pieces 35 of the upper row extend upward from the surrounding member 31. The second elastic pieces 35 of the upper row thus serve to prevent the connecting terminal 22d from withdrawing out of the through hole 17 from the front surface of the printed wiring board 14. The second elastic pieces 35 of the lower row extend downward from the surrounding member 31. Accordingly, the second elastic pieces 35 of the lower row prevent the connecting terminal 22d from withdrawing out of the through hole 17 from the back surface of the printed wiring board 14. The connecting terminal 22d is in this manner reliably held in the through hole 17.

Figure 20:
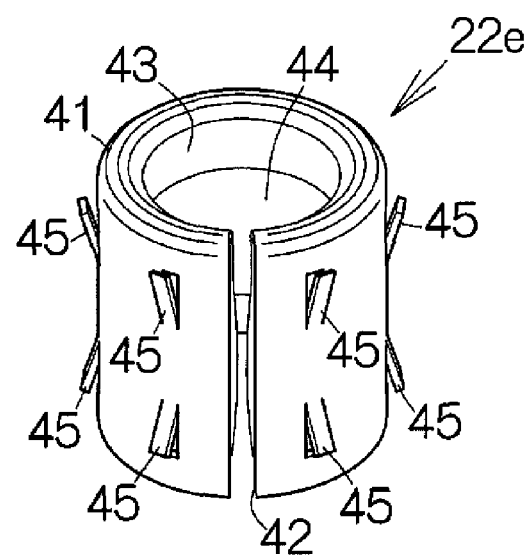
FIG. 20 is a perspective view schematically illustrating a connecting terminal according to a fifth embodiment of the present invention.

FIG. 20 schematically illustrates a connecting terminal 22e according to a fifth embodiment of the present invention. The connecting terminal 22e includes the second elastic pieces 45 arranged in upper and lower rows, for example. Six of the second elastic pieces 45 are included in the upper and lower rows, respectively, for example. The second elastic pieces 45 of the upper row extend upward from the surrounding member 41. The second elastic pieces 45 of the lower row extend downward from the surrounding member 41. Like reference numerals are attached to the structure or components equivalent to those of the aforementioned connecting terminal 22c.

The second elastic pieces 45 serve to hold the connecting terminal 22e within the through hole 17 in the same manner as the aforementioned connecting terminal 22c. The first elastic piece 43 serves to prevent the lead terminal 16 from withdrawing out of the through hole 17. The connecting terminal 22e allows the connector 15 to get mounted on the printed wiring board 14 solely in response to insertion of the lead terminals 16 into the corresponding through holes 17. All of the lead terminals 16 can be fixed to the printed wiring board 14 upon a single application of urging force. This results in omission of soldering. The connecting terminal 22e may be inserted into the through hole 17 in the same manner as the aforementioned connecting terminal 22d.

Moreover, the second elastic pieces 45 of the upper row extend upward from the surrounding member 41. The second elastic piece 45 of the upper row thus serve to prevent the connecting terminal 22e from withdrawing out of the through hole 17 from the front surface of the printed wiring board 14. The second elastic pieces 45 of the lower row extend downward from the surrounding member 41. Accordingly, the second elastic piece 45 of the lower row prevent the connecting terminal 22e from withdrawing out of the through hole from the back surface of the printed wiring board 14. The connecting terminal 22e is in this manner reliably held in the through hole 17.

What is claimed is:

1. A connecting terminal for a printed wiring board, comprising:
    an electrically-conductive ring surrounding a columnar space;
    electrically-conductive elastic pieces extending from the electrically-conductive ring in a direction of a central axis of the columnar space, the electrically-conductive elastic pieces extending into the columnar space; and
    an electrically-conductive blade or blades standing from an outer surface or surfaces of one or more of the electrically-conductive elastic pieces.

2. The connecting terminal according to claim 1, wherein a sliding surface is defined on an inner surface of the elastic piece to allow sliding movement of a lead terminal.

3. The connecting terminal according to claim 1, wherein an outer edge of the blade protrudes outward from the columnar space.

4. A printed circuit board unit comprising:
    a printed wiring board;
    a through hole penetrating through the printed wiring board from a front surface to a back surface of the printed wiring board;
    a connecting terminal received in the through hole, the connecting terminal defining an columnar space inside; and
    an electronic component including a lead terminal received in the columnar space of the connecting terminal, wherein
    the connecting terminal includes:
    an electrically-conductive ring surrounding the columnar space;
    electrically-conductive elastic pieces extending from the electrically-conductive ring in a direction of a central axis of the columnar space so as to get into the columnar space, the electrically-conductive elastic pieces contacting with the lead terminal; and
    an electrically-conductive blade or blades standing from an outer surface or surfaces of one or more of the electrically-conductive elastic pieces, the electrically-conductive blade or blades sticking into an inside surface of the through hole.

5. An electronic apparatus comprising:
    an enclosure; and
    a printed circuit board enclosed in the enclosure, wherein the printed circuit board unit comprises:
    a printed wiring board;
    a through hole penetrating through the printed wiring board from a front surface to a back surface of the printed wiring board;
    a connecting terminal received in the through hole, the connecting terminal defining an columnar space inside; and
    an electronic component including a lead terminal received in the columnar space of the connecting terminal, wherein
    the connecting terminal includes:
    an electrically-conductive ring surrounding the columnar space;
    electrically-conductive elastic pieces extending from the electrically-conductive ring in a direction of a central axis of the columnar space so as to get into the columnar space, the electrically-conductive elastic pieces contacting with the lead terminal; and
    an electrically-conductive blade or blades standing from an outer surface or surfaces of one or more of the electrically-conductive elastic pieces, the electrically-conductive blade or blades sticking into an inside surface of the through hole.

6. A printed circuit board unit comprising:
    a printed wiring board;
    a through hole penetrating through the printed wiring board from a front surface to a back surface of the printed wiring board; and
    a connecting terminal received in the through hole, the connecting terminal defining a columnar space inside, wherein
    the connecting terminal includes:
    an electrically-conductive ring surrounding the columnar space;
    electrically-conductive elastic pieces extending from the electrically-conductive ring in a direction of a central axis of the columnar space so as to get into the columnar space, the electrically-conductive elastic pieces contacting with the lead terminal; and
    an electrically-conductive blade or blades standing from an outer surface or surfaces of one or more of the electrically-conductive elastic pieces, the electrically-conductive blade or blades sticking into an inside surface of the through hole.

7. A connecting terminal for a printed wiring board, the connecting terminal received in a through hole formed in a printed wiring board, the connecting terminal comprising:
    a ring receiving a lead terminal of an electronic component;
    electrically-conductive elastic pieces extending from the ring in a direction of the lead terminal; and
    an electrically-conductive protrusion or protrusions formed on an outer surface or surfaces of one or more of the electrically-conductive elastic pieces.

8. A printed circuit board unit comprising:
    a printed wiring board defining a through hole;
    an electronic component including a lead terminal inserted into the through hole; and
    a connecting terminal received in the through hole to receive the lead terminal, the connecting terminal establishing electric connection between the through hole and the lead terminal, wherein the connecting terminal includes:

a ring receiving the lead terminal;

electrically-conductive elastic pieces extending from the ring in a direction of the lead terminal; and an electrically-conductive protrusion or protrusions formed on an outer surface or surfaces of one or more of the electrically-conductive elastic pieces.

* * * * *